US007260804B1

(12) United States Patent
Burstein et al.

(10) Patent No.: US 7,260,804 B1
(45) Date of Patent: Aug. 21, 2007

(54) METHOD FOR CIRCUIT BLOCK ROUTING BASED ON SWITCHING ACTIVITY

(75) Inventors: Michael Burstein, Cupertino, CA (US); Vladimir Zakladny, San Jose, CA (US); Alexander Kouznetsov, Campbell, CA (US)

(73) Assignee: Golden Gate Technology, Inc., San Jose, CA (US)

( * ) Notice: Subject to any disclaimer, the term of this patent is extended or adjusted under 35 U.S.C. 154(b) by 109 days.

(21) Appl. No.: 10/946,688

(22) Filed: Sep. 21, 2004

(51) Int. Cl.
*G06F 17/50* (2006.01)
(52) U.S. Cl. .......................................... 716/12; 716/14
(58) Field of Classification Search .............. 716/8–10, 716/12–14
See application file for complete search history.

(56) References Cited

U.S. PATENT DOCUMENTS

| | | | |
|---|---|---|---|
| 5,774,380 A * | 6/1998 | Pickup et al. .................. | 703/14 |
| 6,230,304 B1 | 5/2001 | Groeneveld et al. | |
| 6,253,361 B1 | 6/2001 | Buch | |
| 6,397,170 B1 * | 5/2002 | Dean et al. .................... | 703/14 |
| 6,453,446 B1 | 9/2002 | van Ginneken | |
| 6,496,965 B1 | 12/2002 | van Ginneken et al. | |
| 6,507,941 B1 | 1/2003 | Leung et al. | |
| 6,553,338 B1 | 4/2003 | Buch et al. | |
| 6,681,338 B1 * | 1/2004 | Kollipara .................... | 713/503 |
| 6,725,438 B2 | 4/2004 | van Ginneken | |
| 6,950,998 B1 * | 9/2005 | Tuan .............................. | 716/2 |
| 2002/0069396 A1 * | 6/2002 | Bhattacharya et al. ......... | 716/7 |
| 2005/0050496 A1 * | 3/2005 | Kovacs et al. .................. | 716/6 |

OTHER PUBLICATIONS

Jim Flynn and Brandon Waldo; Power Management in Complex SoC Design (16 Pages); Apr. 2004; Synopsis, Inc., 700 East Middlefield Rd., Mountain View, CA 94043; http://www.synopsys.com/sps.
Astro-Rail: A Comprehensive Power-Integrity Analysis, Implementation and Verification Tool (2 Pages); Data Sheet, May 2003; Synopsis, Inc., 700 East Middlefield Rd., Mountain View, CA 94043.

* cited by examiner

*Primary Examiner*—Stacy A Whitmore
(74) *Attorney, Agent, or Firm*—Andrew D. Fortney

(57) ABSTRACT

A method, algorithm, software, architecture and/or system for routing signal paths or connections between circuit blocks in a circuit design is disclosed. In one embodiment, a method of routing can include: (i) determining a switching activity for signal path between a first circuit block and a second circuit block; and (ii) routing the signal path substantially in a connectivity layer related to the switching activity of the signal path. The circuit blocks can include standard cells configured to implement a logic or timing function, other components, and/or integrated circuits, for example. The switching activity can include a switching frequency determination based on simulation results of the signal path between the circuit blocks. Embodiments of the present invention can advantageously reduce power consumption as well as supply noise by optimally routing signal paths between circuit blocks in an automated place-and-route flow. Further, signal integrity problems due to non-optimal routing can be reduced or minimized relative to conventional techniques.

44 Claims, 7 Drawing Sheets

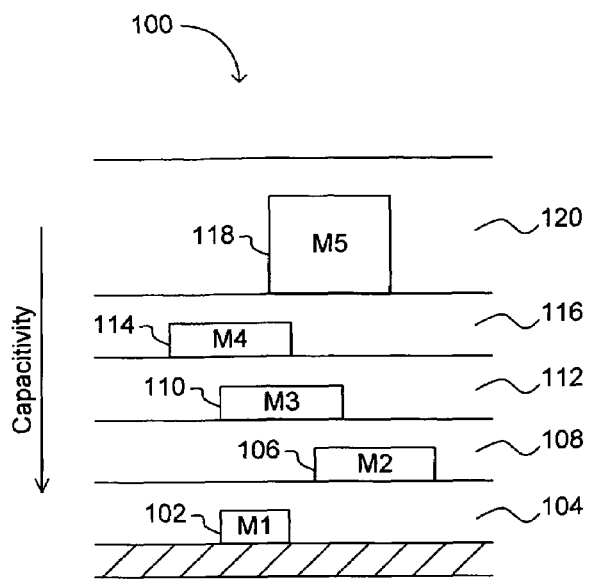
FIG. 1A (conventional)
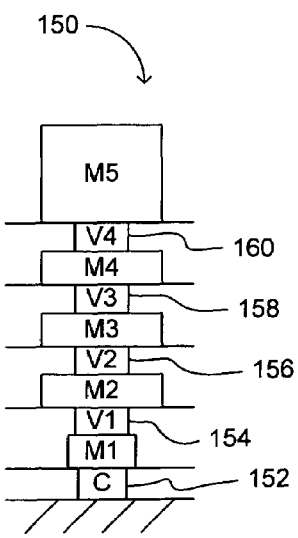
FIG. 1B (conventional)

METHOD FOR CIRCUIT BLOCK ROUTING BASED ON SWITCHING ACTIVITY

FIELD OF THE INVENTION

The present invention generally relates to the field of circuit design, particularly integrated circuit (IC) design. More specifically, embodiments of the present invention pertain to methods, algorithms, software, systems and architectures for reducing power consumption and improving signal integrity in the design of an IC.

DISCUSSION OF THE BACKGROUND

In typical circuit design, circuit components are arranged to optimize space and/or circuit performance. Such arrangements can include the "layout" or pattern definition of each of the layers used in a semiconductor manufacturing process. For example, such layout can include metal interconnect or connectivity layers that are converted to masks or reticles for use in a wafer fabrication facility that manufactures ICs (i.e., "chips").

While some circuits are designed using "custom" layout, others are designed using a partially or fully automated design flow. Application-Specific Integrated Circuit (ASIC) designs, as well as other functional blocks within a larger chip, such as System-On-Chip (SOC) designs, may employ custom and/or ASIC type flows on the same chip. In any event, typical ASIC flows use "place-and-route" tools for placing logic or circuit "blocks" and then "routing" or connecting the interface signals between the blocks. Such routing between circuit blocks is typically done using one or more metal connectivity layers.

Referring now to FIG. 1A, a conventional connection layer cross section diagram is shown and indicated by the general reference character 100. The five metal layers shown include metal-1 (M1) 102, metal-2 (M2) 106, metal-3 (M3) 110, metal-4 (M4) 114, and metal-5 (M5) 118. Dielectric 104 isolates the M1 connectivity layer, dielectric 108 isolates the M2 connectivity layer, dielectric 112 isolates the M3 connectivity layer, dielectric 116 isolates the M4 connectivity layer, and dielectric 120 isolates the M5 connectivity layer. In FIG. 1B, layer-to-layer connections associated with the diagram of FIG. 1A are shown and indicated by the general reference character 150. In FIG. 1B, contact (C) 152 connects M1 to a layer below, via-1 (V1) 154 connects M2 to M1, via-2 (V2) 156 connects M3 to M2, via-3 (V3) 158 connects M4 to M3, and via-4 (V4) 160 connects M5 to M4. In conventional automated signal path routing approaches, either certain connectivity layers are strictly designated for specific signal categories (e.g., M5 for power signal routing, M4 for clock signals, etc.) to restrict routing choices, or the routing is randomized with respect to the connectivity layer so as to emphasize minimized layout area.

However, such conventional approaches to automated signal path routing are typically not optimized for power consumption or signal integrity concerns. Limitations of such conventional approaches result from the routing not being done with sufficient consideration of the "capacitivity" (i.e., capacitance per unit length or area) and the switching activity of the signal path. Accordingly, a signal path routing using a conventional approach may not minimize the capacitivity for a high switching activity signal.

Given the increasing demands on circuit designers to create chips of increasing density, decreasing wire and transistor widths, and decreasing power supply and power consumption, it is difficult to ensure optimal signal path routing in a manner that also takes steps to minimize power consumption, particularly in an automated routing flow. Increasing the complexity, flexibility and/or functionality of the circuitry on a chip exacerbates these challenges. Thus, what is needed is a tool with which integrated circuit designers can automatically optimize signal path routing so as to reduce power consumption and increase signal integrity.

SUMMARY OF THE INVENTION

Embodiments of the present invention relate to methods, algorithms, software, architectures and/or systems for routing signals or wires between circuit blocks in a circuit design.

In one embodiment, a method of routing can include: (i) determining a switching activity for signal path between a first circuit block and a second circuit block; and (ii) routing the signal path substantially in a connectivity layer related to the switching activity of the signal path. The circuit blocks can include standard cells configured to implement a logic or timing function, other components, and/or integrated circuits, for example. The switching activity can include a switching frequency determination based on simulation results of the signal path between the circuit blocks.

Embodiments of the present invention can advantageously reduce power consumption as well as supply noise by optimally routing signal paths between circuit blocks in an automated place-and-route flow. Further, signal integrity problems due to non-optimal routing can be reduced or minimized relative to conventional techniques. Embodiments of the invention are suitable for the automated routing of signal paths between circuit blocks within an integrated circuit (IC) and/or routing between ICs or components on a board, such as a printed circuit board (PCB).

These and other advantages of the present invention will become readily apparent from the detailed description of preferred embodiments below.

BRIEF DESCRIPTION OF THE DRAWINGS

FIG. 1A is a conventional connection layer cross section diagram showing metal layers.

FIG. 1B is a conventional connection layer cross section diagram showing layer-to-layer connections.

DETAILED DESCRIPTION OF THE PREFERRED EMBODIMENTS

Figure 2A:
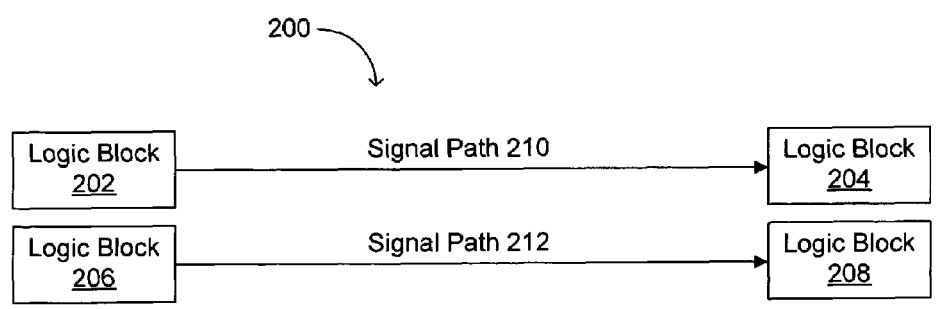
FIG. 2A is a box diagram showing circuit block signal path connections that may be used in embodiments of the present invention.

Reference will now be made in detail to the preferred embodiments of the invention, examples of which are illustrated in the accompanying drawings. While the invention will be described in conjunction with the preferred embodiments, it will be understood that they are not intended to limit the invention to these embodiments. On the contrary, the invention is intended to cover alternatives, modifications and equivalents, which may be included within the spirit and scope of the invention as defined by the appended claims. Furthermore, in the following detailed description of the present invention, numerous specific details are set forth in order to provide a thorough understanding of the present invention. However, it will be readily apparent to one skilled in the art that the present invention may be practiced without these specific details. In other instances, well-known methods, procedures, components, and circuits have not been described in detail so as not to unnecessarily obscure aspects of the present invention.

Some portions of the detailed descriptions which follow are presented in terms of processes, procedures, logic blocks, functional blocks, processing, and other symbolic representations of operations on code, data bits, data streams or waveforms within a computer, processor, controller and/or memory. These descriptions and representations are generally used by those skilled in the data processing arts to effectively convey the substance of their work to others skilled in the art. A process, procedure, logic block, function, process, etc., is herein, and is generally, considered to be a self-consistent sequence of steps or instructions leading to a desired and/or expected result. The steps generally include physical manipulations of physical quantities. Usually, though not necessarily, these quantities take the form of electrical, magnetic, optical, or quantum signals capable of being stored, transferred, combined, compared, and otherwise manipulated in a computer or data processing system. It has proven convenient at times, principally for reasons of common usage, to refer to these signals as bits, waves, waveforms, streams, values, elements, symbols, characters, terms, numbers, or the like, and to their representations in computer programs or software as code (which may be object code, source code or binary code).

It should be borne in mind, however, that all of these and similar terms are associated with the appropriate physical quantities and/or signals, and are merely convenient labels applied to these quantities and/or signals. Unless specifically stated otherwise and/or as is apparent from the following discussions, it is appreciated that throughout the present application, discussions utilizing terms such as "processing," "operating," "computing," "calculating,""determining," "manipulating," "transforming," "displaying" or the like, refer to the action and processes of a computer or data processing system, or similar processing device (e.g., an electrical, optical, or quantum computing or processing device), that manipulates and transforms data represented as physical (e.g., electronic) quantities. The terms refer to actions and processes of the processing devices that manipulate or transform physical quantities within the component(s) of a system or architecture (e.g., registers, memories, other such information storage, transmission or display devices, etc.) into other data similarly represented as physical quantities within other components of the same or a different system or architecture.

Furthermore, in the context of this application, the terms "net list" (or "netlist") and "hardware description" may be used interchangeably to refer to a circuit design represented in an appropriate language, such as VERILOG simulation language, Hardware Description Language (HDL) or VERILOG HDL (VHDL; VERILOG is a registered trademark of Gateway Design Automation Corporation for computer aided electrical engineering programs). Similarly, the terms "wire," "wiring," "line," "signal," "conductor" and "bus" refer to any known structure, construction, arrangement, technique, method and/or process for physically transferring a signal from one point in a circuit to another. Also, unless indicated otherwise from the context of its use herein, the terms "known," "fixed," "given," "certain" and "predetermined" generally refer to a value, quantity, parameter, constraint, condition, state, process, procedure, method, practice, or combination thereof that is, in theory, variable, but is typically set in advance and not varied thereafter when in use.

Similarly, for convenience and simplicity, the terms "clock," "time," "timing,""rate," "period" and "frequency" are, in general, interchangeable and may be used interchangeably herein, but are generally given their art-recognized meanings. Also, for convenience and simplicity, the terms "data," "data stream," "waveform" and "information" may be used interchangeably, as may (a) the terms "flip-flop," "latch" and "register," and (b) the terms "connected to," "coupled with," "coupled to," and "in communication with," but these terms are generally given their art-recognized meanings herein.

The present invention concerns a method and/or algorithm (e.g., a computer-readable set of instructions) for routing signal paths or connections between circuit blocks, and can include: (i) determining a switching activity for a signal path between first and second circuit blocks; and (ii) routing the signal path substantially in a connectivity layer related to the switching activity of the signal path. The circuit blocks can include standard cells configured to implement a logic or timing function, other components, and/or integrated circuits, for example. The switching activity can include a switching frequency determination based on simulation results of the signal path between the circuit blocks.

In a further aspect of the invention, software relates to a medium or waveform containing a computer-readable set of instructions, where the instructions can include: (i) determining a weighting of a signal path between first and second circuit blocks; and (ii) routing the signal path substantially in a connectivity layer related to the weighting. The weighting can each include a switching activity factor for the signal paths.

In another aspect of the invention, a method and/or algorithm of connecting can include: (i) placing first and second circuit blocks; (ii) determining a signal path between the first and second circuit blocks; (iii) determining a switching activity for the signal path; and (iv) if the switching activity is above a predetermined value, routing the signal path substantially in a first connectivity layer instead of a second connectivity layer. The first connectivity may have a lower capacitivity than the second connectivity layer.

In another aspect of the invention, a connection of circuit blocks can include: (i) a first circuit block coupled to a second circuit block via a signal path; and (ii) a connectivity layer substantially forming the signal path being based on a switching activity of the signal path.

Embodiments of the present invention can advantageously reduce power consumption as well as supply noise by optimally routing signal paths between circuit blocks in an automated place-and-route flow. Further, signal integrity problems due to non-optimal signal path routing can be reduced or minimized. Embodiments of the invention are suitable for the automated routing of signal paths or connections between circuit blocks within an integrated circuit (IC) and/or between ICs or components on a board, such as a printed circuit board (PCB).

The invention further relates to hardware and/or software implementations of the present architecture, method and system. The invention, in its various aspects, will be explained in greater detail below with regard to exemplary embodiments.

Referring now to FIG. 2A, a box diagram showing circuit block signal path connections that may be used in embodiments of the present invention is indicated by the general reference character 200. Logic Block 202 can interface to Logic Block 204 via signal or "signal path" 210. Logic Block 206 can interface to Logic Block 208 via signal path 212. In this example, the switching activity of signal 212 may be higher than the switching activity of signal 210. For example, signal 212 may switch state (i.e., from a "high" or "1" to a "low" or "0" or vice versa) ten times in a given time period. However, in that same given time period, signal 210 may only switch state one time. Because the current drawn from the power supply is proportional to the capacitive load being driven, it is typically desirable to minimize the capacitive load or "capacitivity" of the routed connections, particularly for signals that may switch states often (i.e., high "switching activity" signals). According to embodiments of the present invention, the switching activity of each of signal paths 210 and 212 can be determined and compared, either directly or indirectly, with a predetermined threshold value or with each other so as to minimize the capacitivity of the signal path routing.

Figure 2B:
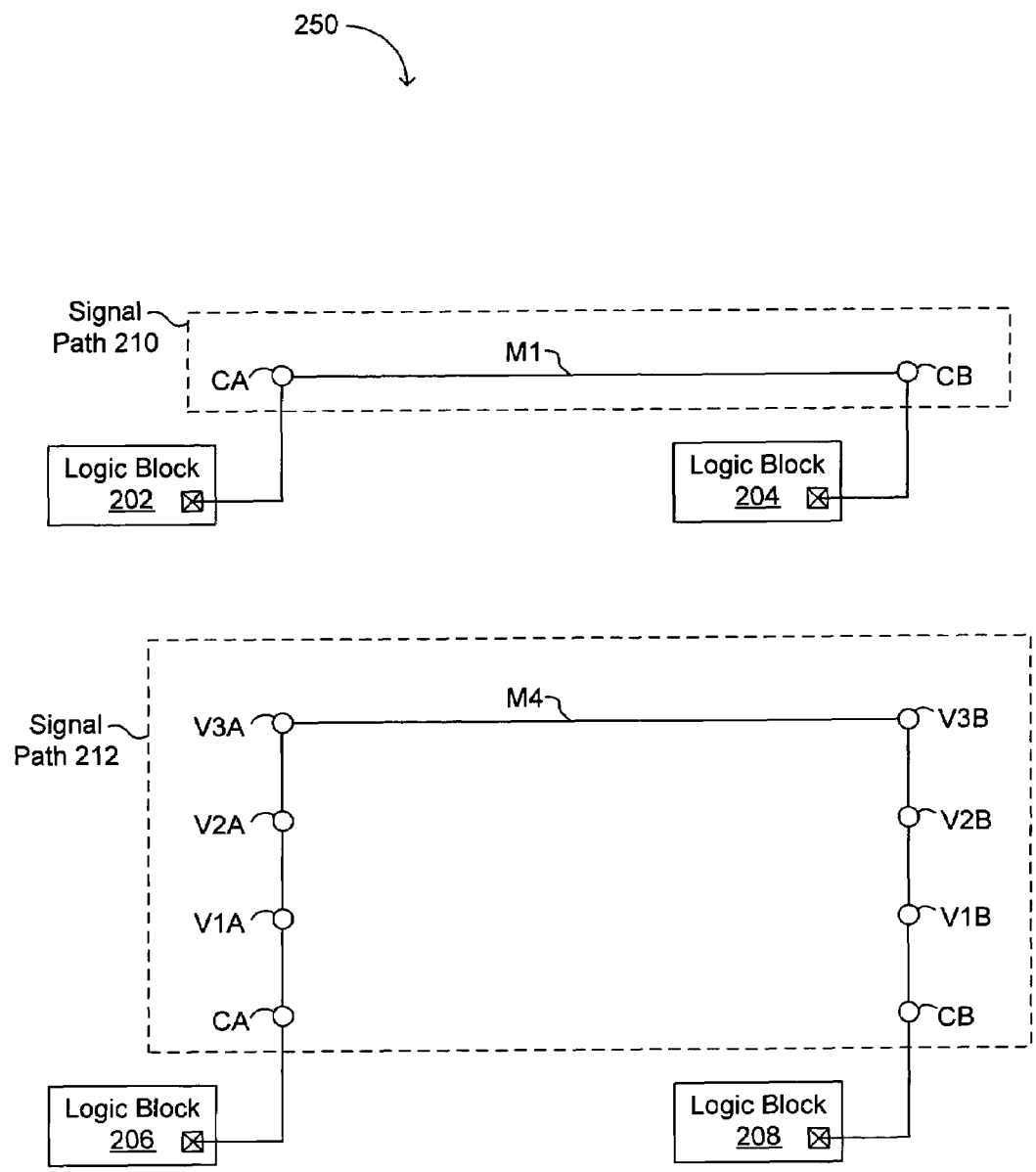
FIG. 2B is a schematic diagram showing an exemplary signal path routing for the circuit of FIG. 2A resulting from the use of embodiments of the present invention.

Referring now to FIG. 2B, a schematic diagram showing an exemplary signal path routing for the circuit of FIG. 2A resulting from the use of embodiments of the present invention is indicated by the general reference character 250. Following the example of FIG. 2A, signal path 210 may have a relatively low switching activity. Accordingly, signal path 210 may be routed substantially in a relatively high capacitivity layer, such as metal-1 (M1). As shown in FIG. 2B, signal path 210 may include a connection from Logic Block 202 to the M1 layer through a contact (CA). Most of the signal path length can be routed in M1 and the connection to Logic Block 204 can be made through another contact (CB). Of course, as one skilled in the art will recognize, signal path 210 may also be routed partially in another connectivity layer, such as a higher layer (e.g., metal-2 (M2)), based on process technology (e.g., design rules restricting maximum routing in a connectivity layer) and/or design constraints without departing from the scope of the present invention.

Signal path 212, however, may have a relatively high switching activity. Accordingly, signal path 212 may be routed substantially in a relatively low capacitivity layer, such as metal-4 (M4). Signal path 212 can include connections from Logic Block 206 to M4 through a contact (CA), a via-1 (V1A), a via-2 (V2A), and a via-3 (V3A). Most of the signal path length can be routed in M4 and the connection to Logic Block 208 can be completed through via-3 (V3B), via-2 (V2B), via-1 (V1B), and contact (CB) connections. Of course, as one skilled in the art will recognize, signal path 212 may also be routed partially in another connectivity layer, such as a higher layer (e.g., metal-5 (M5)) or a lower layer (e.g., metal-3 (M3)), based on process technology (e.g., design rules restricting maximum routing in a connectivity layer) and/or design constraints without departing from the scope of the present invention.

In this fashion, a signal path can be routed between circuit or logic blocks, or other routing termination points (e.g., ports or other designations for subsequent signal connections), relative to a switching activity of the signal path. Accordingly, the capacitance of signal paths for certain higher switching activity signals can typically be reduced by routing substantially on lower capacitivity layers. Thus, the overall power consumption of a circuit can effectively be reduced by the use of embodiments of the present invention. In one implementation, a power reduction of about 3-4% was realized. Further, signal integrity problems (e.g., due to power supply noise) can also be reduced or minimized due to increased power supply stability. Also, a particularly advantageous application for embodiments of the present invention involves routing clock signals or other high switching activity type signals in a highest available connectivity layer.

Of course, as one skilled in the art will recognize, embodiments of the present invention are also applicable to analog, ternary, or other non-digital circuits. As one example, "small-signal" circuits, either alone or embedded within a larger chip or PCB may employ embodiments of the present invention. In general, embodiments of the present invention can be used in the routing of signal paths between circuit blocks or other routing termination points having interface signals that change states. Further, such state changes suitable for a "switching activity" determination may be of any type (e.g., analog, digital, etc.) recognizable by the interfacing or surrounding circuitry.

Figure 3A:
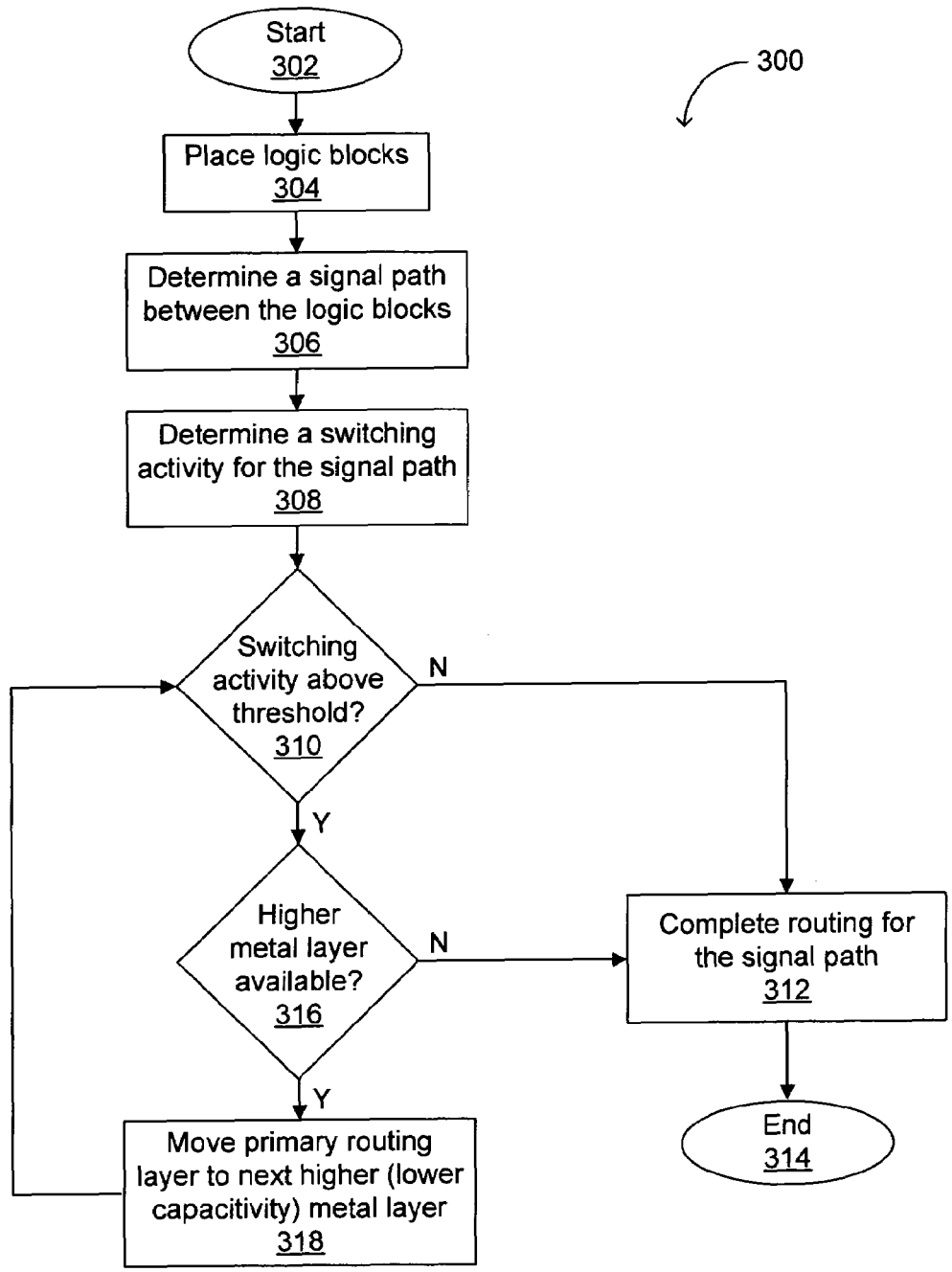
FIG. 3A is a flow diagram showing a signal path routing method according to an embodiment of the present invention.

Referring now to FIG. 3A, a flow diagram showing a signal path routing method according to an embodiment of the present invention is indicated by the general reference character 300. The flow can begin in Start 302 and logic blocks or the like can be placed (304). Next, a signal path can be determined between the logic blocks (306). Of course, any appropriate signal path suitable for automated routing can be determined. Such a determination of an "interface" between logic blocks can be made by reference to a "netlist" file. Netlist files can be generated, for example, by a synthesizer based on a Hardware Description Language (HDL) representation of the logic functions of a circuit (which generally includes the logic blocks of the circuit), as will be discussed in more detail below with reference to FIG. 5.

In FIG. 3A, switching activity information for the signal path may next be accessed (308). Such switching activity information can include a switching frequency based on an event-driven simulation, such as a VERILOG simulation. Further, the switching activity information can include a user-controlled factor that may be multiplied with a switching activity (i.e., switching frequency) factor, as shown in formula (1), as follows:

$$\text{weight(net)} = \text{length(net)} + P * \text{Sw(net)} \quad (1)$$

The result term "weight(net)" can be a weighting so as to designate the relative routing or connectivity layer of a signal path. The term "length(net)" can be an initial length of the signal path, such as may be determined by a distance between logic block placements or other routing termination points. Alternatively, "length(net)" can represent a current or a projected length of a signal path due to other routing constraints, for example. The term "P" in the above formula may be the user-controlled factor. The user-controlled factor can be a representation of the importance or priority of a particular signal path relative to other signal paths. For example, a clock signal may have a high priority designation by a user. Further, the term "Sw(net)" can be a switching frequency or switching activity term, for example. As discussed above, this term can be determined by way of simulation of a netlist representation of the overall circuit, for example.

The weighting ("weight(net)") can be used as a more detailed measure of the "switching activity" of a signal path so as to determine an optimized substantial routing layer. Accordingly, a primary or substantial routing layer can be changed according to embodiments of the present invention by comparing the weighting for a signal path against a predetermined value. In an alternate embodiment, a more direct "switching activity" measure, such as strictly the "Sw(net)" term can be used to compare against the predetermined or threshold value to obtain an optimal routing layer for a given signal path.

Continuing with FIG. 3A, the switching activity can be compared against a predetermined or "threshold" value (310). The threshold may be different for each connectivity layer or a same threshold value may be used for each of the connectivity layers. If the switching activity is below the threshold, the routing for the signal path can be completed substantially in the current connectivity layer (312) and the flow can complete in End 314. However, if the switching activity is above the designated threshold, the automated router flow can look to see if a higher layer of connectivity is available (316). This can include a higher metal layer (i.e., lower capacitivity layer). If no higher layer is available, the signal path can be completed substantially in the current connectivity layer (312) and the flow can complete in End 314. No further layers may be available due to either all connectivity layers in the process technology being used in the current signal path route or where the top one or two metal layers (e.g., metal-7 and metal-8 in an eight metal layer process) are reserved for power supply routing, for example. If, however, a higher metal layer is available, the primary routing layer can be moved to the next higher layer (i.e., lower capacitivity layer) (318) and the flow can return to decision box 310.

In this fashion, a signal path can be routed in a connectivity layer optimized based on the switching activity of the signal path. Further, the routing can also be made dependent on a user-controlled factor as well as an initial and/or projected signal path length.

Figure 3B:
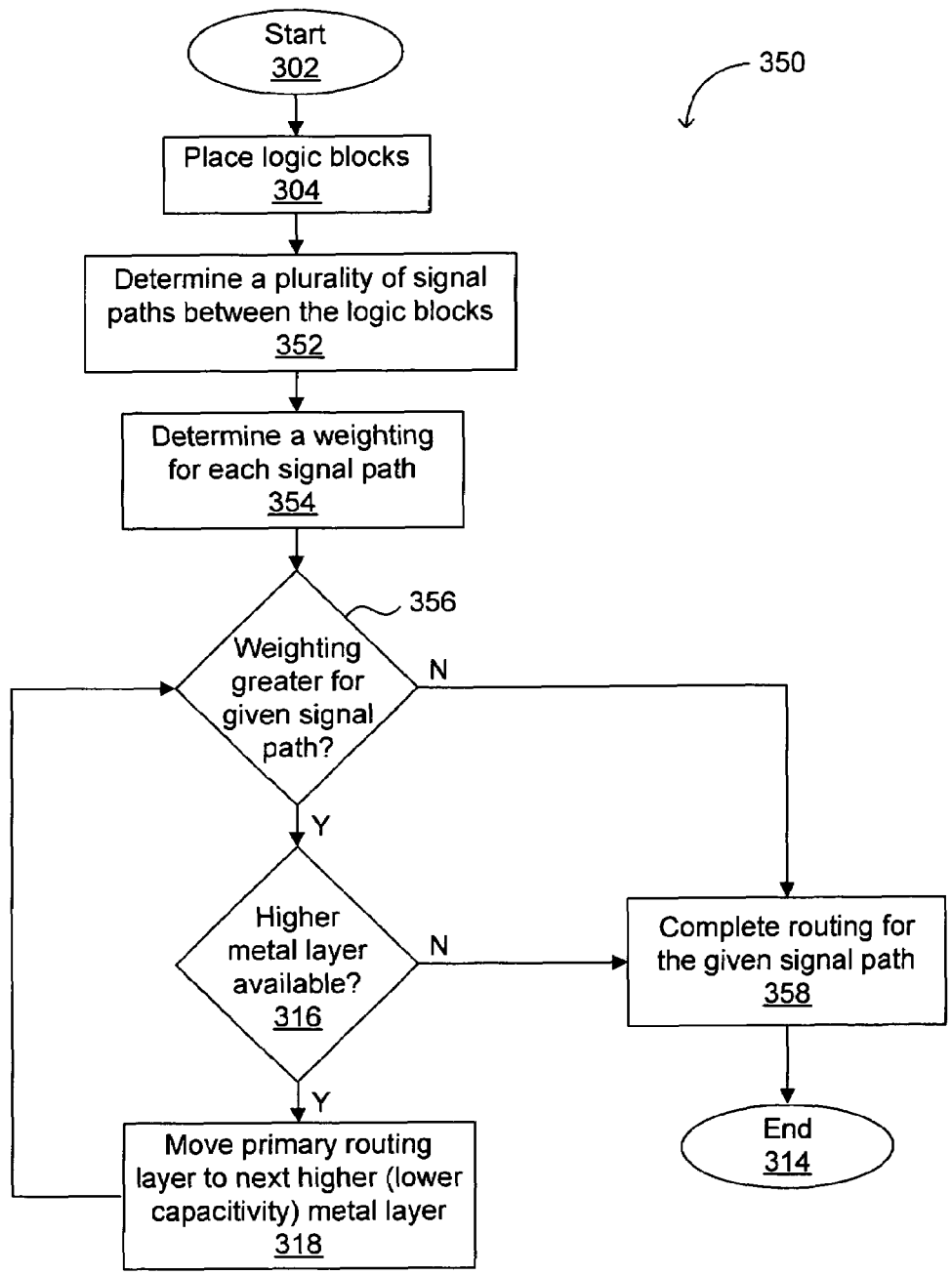
FIG. 3B is a flow diagram showing a signal path routing method according to an alternate embodiment of the present invention.

Referring now to FIG. 3B, a flow diagram showing a signal path routing method according to an alternate embodiment of the present invention is indicated by the general reference character 350. For blocks or elements serving the same or similar functions as those of FIG. 3A, the same block number is used. Accordingly, blocks 302, 304, 314, 316, and 318 are the same or similar to the corresponding blocks shown in FIG. 3A.

In the alternate embodiment of FIG. 3B, once the logic blocks are placed (304), a plurality of signal paths between the logic blocks can be determined (352). A weighting for each of the signal paths can be determined (354) in similar fashion as discussed above. For a given signal path (e.g., a signal path undergoing automated routing), a weighting for the given signal path can be compared against a weighting for another signal path (356). If the weighting for the given signal path is less than the weighting of the other signal path in the comparison, the routing can be completed for the given signal path (358) and the flow can complete in End 314. If, however, the weighting for the given signal path is greater than the other signal path in the comparison, a determination of whether a higher layer is available for routing can be made (316). If no higher layer is available, the routing for the given signal path can be completed (358) and the flow can complete in End 314. If there is a higher layer available for routing, the routing for the given signal path can be moved to the next higher layer (318) and the flow can return to the weighting comparison (356), as discussed above.

Figure 4A:
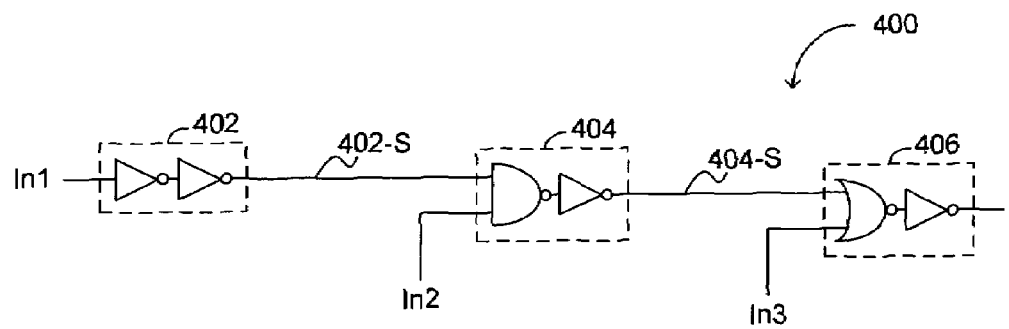
FIG. 4A is schematic diagram showing an exemplary circuit that may be used in embodiments of the present invention.

Referring now to FIG. 4A, a schematic diagram showing an exemplary circuit that may be used in embodiments of the present invention is indicated by the general reference character 400. This example shows a simple circuit structure using standard cells or gates to implement logic or other functions that is suitable for IC design. Such logic functions could include AND/NAND, OR/NOR, XOR/XNOR, INV, or flip-flops, as just a few examples. In practice, any circuit can be designed and treated as a "standard cell" for automatic placement and routing in a larger design. More commonly, a set of standard cells are provided and characterized for each design technology and are utilized in an "off-the-shelf" manner in a typical ASIC design flow.

Figure 4B:
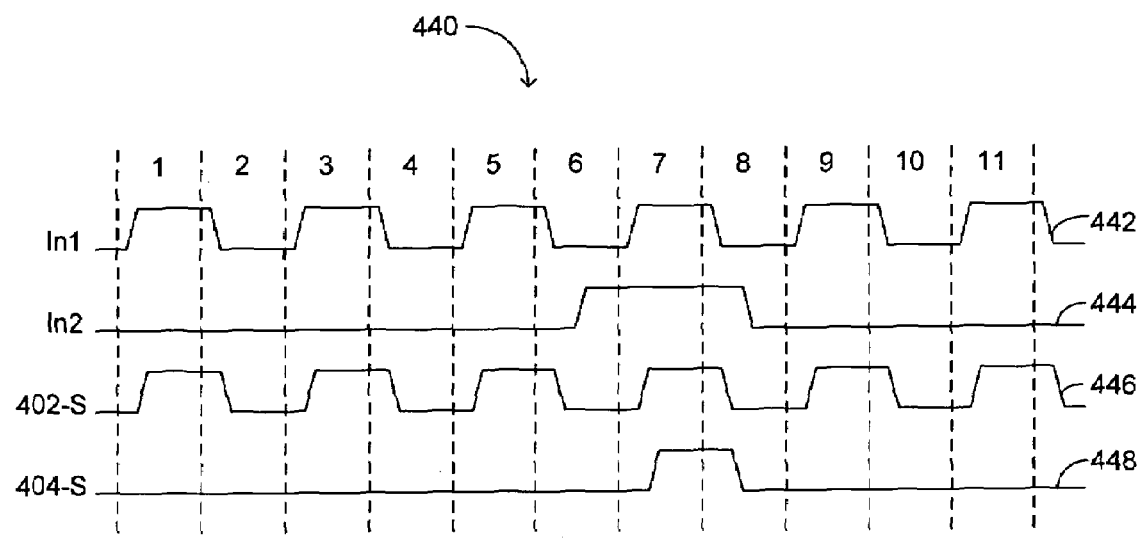
FIG. 4B is an exemplary timing diagram for the circuit of FIG. 4A.

In the example of FIG. 4A, standard cell 402 can be a buffer stage receiving input In1 and outputting signal 402-S. Standard cell 404 can be an "AND" function having a NAND-gate followed by an inverter. Standard cell 404 can receive signal 402-S and input In2 and can output signal 404-S. Standard cell 406 can be an "OR" function having a NOR-gate followed by an inverter. Standard cell 406 can receive signal 404-S and input In3. Embodiments of the present invention can be used to determine an optimized routing for signal paths 402-S and 404-S based on their respective switching activities. Consistent with such embodiments, a simulation of circuit 400 may be done to determine the switching activity of signals 402-S and 404-S Referring now to FIG. 4B, an exemplary timing diagram for the circuit of FIG. 4A is shown and indicated by the general reference character 440. Such a timing diagram can be a waveform representation of a VERILOG simulation result, such as a Value Change Data (VCD) file, for example. Input In1 (waveform 442) can be an oscillating signal, such as a clock, and may go high (i.e., transition from "0" to "1") in odd cycles and go low (i.e., transition from "1" to "0") in even cycles. Input In2, which may be a clock enable signal, for example, can go high in cycle 6 and go low in cycle 8, as shown by waveform 444. Signal 402-S (waveform 446) can be a simple delay of In1 because signal 402-S is the output of buffer stage 402. Signal 404-S can go high in cycle 7 and go low in cycle 8 to reflect the "AND" function of standard cell 404. Thus, over the time period of 11 cycles shown in FIG. 4B, the switching activity of signal 402-S is six times the switching activity of signal 404-S (i.e., six full switching cycles for 402-S versus only one switching cycle for 404-S).

The switching activity of various signals in a circuit, where that circuit has been simulated, can also be determined using a commercially available or custom software tool. For example, if the circuit simulation is done using VERILOG simulation language, a VCD file can be created as an output file. A switching activity interface (SAIF) can be used to determine the switching activity of each signal or "net" in the circuit. An example of a free utility for conversion of a VCD output to SAIF is the "vcd2saif" script, which is available from Synopsys, Inc., of Mountain View, Calif. (www.synopsys.com; in particular, see www.synopsys.com/partners/tapin/saif.html).

Figure 4C:
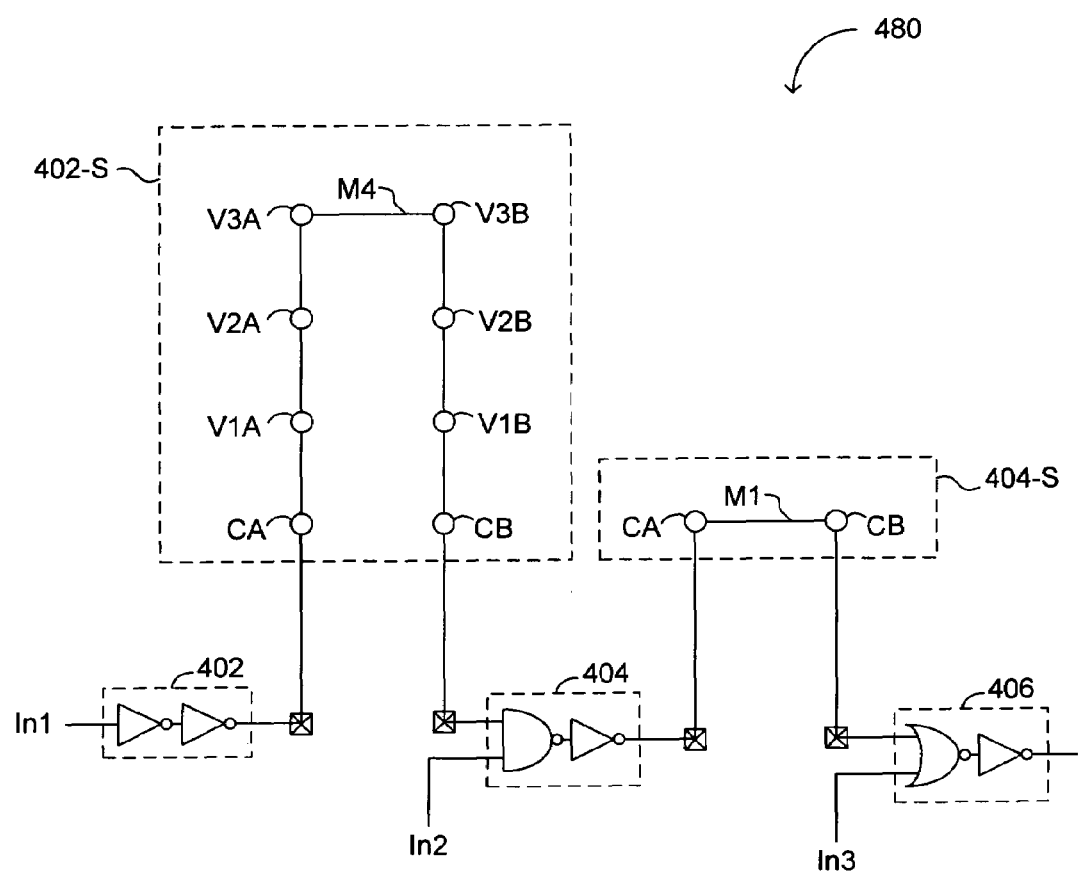
FIG. 4C is a schematic diagram showing a signal path routing for the circuit of FIG. 4A resulting from the use of embodiments of the present invention.

Referring now to FIG. 4C, a schematic diagram showing a signal path routing for the circuit of FIG. 4A resulting from the use of embodiments of the present invention is indicated by the general reference character 480. Based on the switching activity of signals 402-S and 404-S in the above example, signal path 402-S can be routed substantially in a relatively low capacitivity layer (e.g., metal-4 (M4)) and signal path 404-S can be routed in a relatively high capacitivity layer (e.g., metal-1 (M1)). Signal path 402-S can include connections from standard cell 402 to M4 through a contact (CA), a via-1 (V1A), a via-2 (V2A), and a via-3 (V3A). Most of the signal path length can be routed in M4 and the connection to standard cell 404 can be completed through via-3 (V3B), via-2 (V2B), via-1 (V1B), and contact (CB) connections. Signal path 404-S may include a connection from standard cell 404 to the M1 layer through a contact (CA). Most of the signal path length can be routed in M1 and the connection to standard cell 406 can be made through another contact (CB).

In this fashion, power consumption due to driving the relatively high switching frequency signal 402-S can be reduced or minimized. Further, the signal integrity of all signals affected by localized power supply noise in the region of standard cells 402, 404, and 406 can be improved because such noise can be reduced or minimized according to embodiments of the present invention.

While the exemplary circuit block arrangements discussed above generally show the routing of signal paths between circuit blocks, these illustrations should not be considered limiting. As one skilled in the art will recognize, such routing may be accomplished between any two or more designated points and embodiments of the present invention are equally adaptable to such applications. Further, the routing can be done on any type of connectivity layer, including polysilicon. In one embodiment, such routing can be done for multiple connections to a common line, such as a clock signal, based on the signal switching activity. In any event, in accordance with embodiments of the present invention, any signal paths may be routed substantially in a layer in relation to the switching activity of the signal path.

Figure 5:
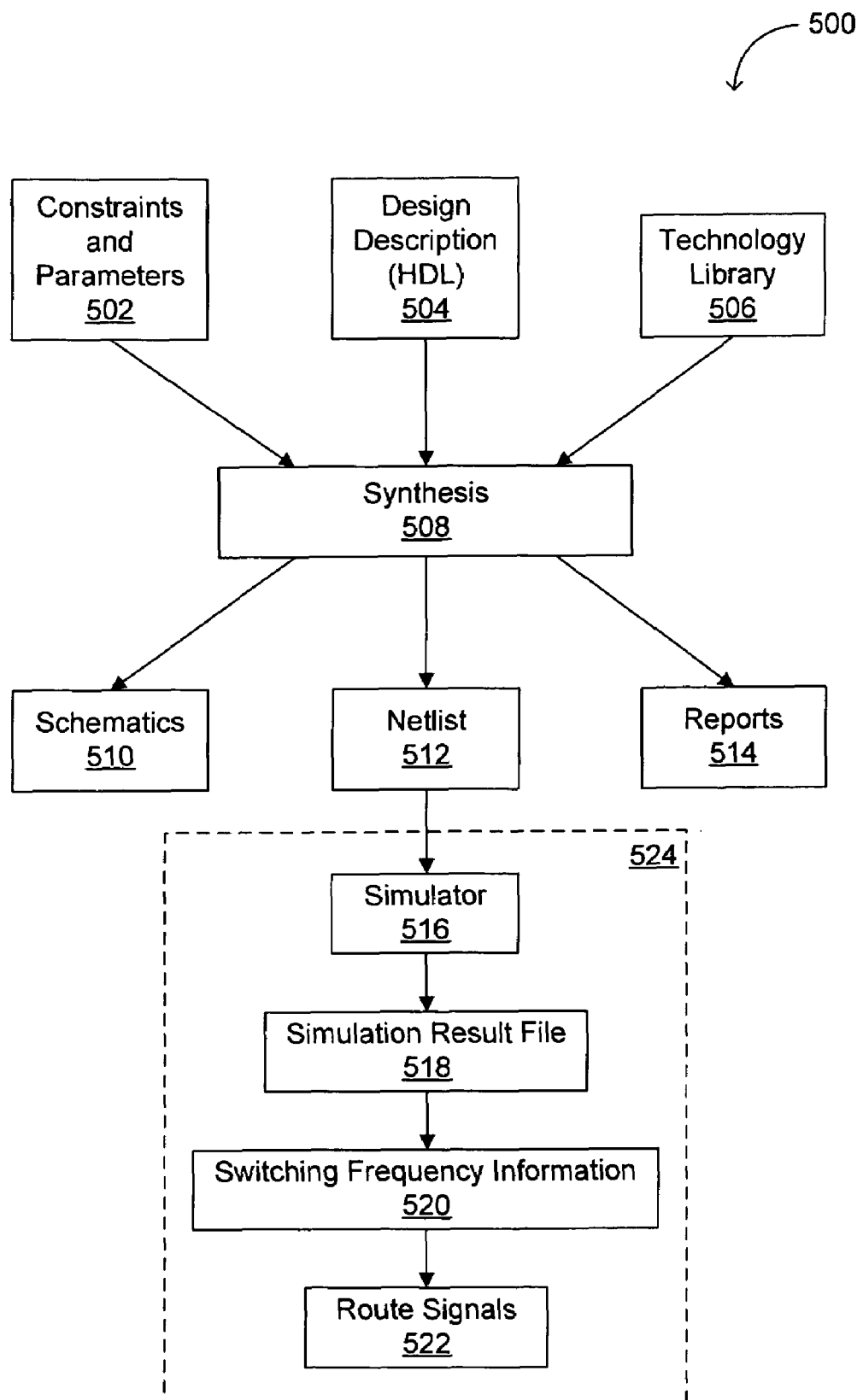
FIG. 5 is a box diagram showing a synthesis flow adapted for use with embodiments of the present invention.

Referring now to FIG. 5, a box diagram showing a synthesis flow adapted for use with embodiments of the present invention is indicated by the general reference character 500. Box 524 shows elements adapted for use in accordance with embodiments of the present invention. The remaining boxes in FIG. 5 represent a conventional synthesis flow. Inputs to Synthesis 508 typically include Constraints and Parameters 502, Design Description (HDL) 504, and Technology Library 506. Constraints and Parameters 502 may include physical expectations of the design, such as the circuit operating speed and/or the circuit layout area. Design Description (HDL) 504 can be a VERILOG HDL (VHDL) description of the logic operation(s) for synthesis. Technology Library 506 may contain a functional description as well as other information, such as may be related to the area and speed of all standard cells in a given process technology. For example, Technology Library 506 may be specific to a technology generation (e.g., 0.13 micron technology), a company (e.g., TSMC), and a process type (e.g., CMOS; eight-level metal; fast/normal/slow lot variation).

Outputs from Synthesis 508 may include Schematics 510, Netlist 512, and Reports 514. Schematics 510 can be schematic representations of the synthesized functions of Design Description (HDL) 504. Netlist 512 can be a text file description of a physical connection of components, such as standard cells, and can include a description of the various circuit blocks in the design and signal paths between the circuit blocks. Reports 514 can include speed and area data associated with results of Synthesis 508.

As discussed above, a netlist representation (e.g., Netlist 512) may be used for simulation to determine the switching activity of various signals. Accordingly, Simulator 516 can receive Netlist 512 and provide Simulation Result File 518. For example, Simulator 516 can be a VERILOG simulator and Simulation Result File 518 can be a VCD file. Simulation Result File 518 can be used to determine Switching Frequency Information 520. As discussed above, this can be accomplished by the use of a "vcd2saif" utility, for example. Finally, Route Signals 522 can receive Switching Frequency Information 520 so as to make optimized signal path routes based on the switching activity of the associated signals.

In this fashion, a conventional ASIC type design flow including synthesis can be adapted for routing of signal paths between standard cells in accordance with embodiments of the present invention. Alternatively, embodiments of the present invention may be used in other design flows whereby a switching activity of signals can be determined via simulation or other means.

Further examples of suitable systems, tools and/or methods in which the present invention is generally applicable include those described in, e.g., U.S. Pat. Nos. 6,080,201 and 5,798,936, the relevant portions of which are each incorporated herein by reference, and those commercially available from place-and-route software vendors such as Cadence Design Systems (e.g., the SILICON ENSEMBLE™, SILICON ENSEMBLE-PKS™, FIRST ENCOUNTER™, and NANO ENCOUNTER™ tools), Silicon Valley Research, Inc. (e.g., the QIC/APR™, GARDS™, SC™ and FLOORPLACER™ tools), Synopsys (e.g., the CHIP ARCHITECT™, DESIGN COMPILER™, and FLOORPLAN COMPILER™ tools) and Mentor Graphics (e.g., the AUTOCELLS™ tool).

Thus, embodiments of the present invention can advantageously reduce power consumption as well as supply noise by optimally routing signal paths between circuit blocks in an automated place-and-route flow. Further, signal integrity problems due to non-optimal signal path routing can be reduced or minimized. Embodiments of the invention are suitable for the automated routing of signal paths between circuit blocks within an IC and/or routing between ICs or components on a board, such as a printed circuit board (PCB).

The foregoing descriptions of specific embodiments of the present invention have been presented for purposes of illustration and description. They are not intended to be exhaustive or to limit the invention to the precise forms disclosed, and obviously many modifications and variations are possible in light of the above teaching. The embodiments were chosen and described in order to best explain the principles of the invention and its practical application, to thereby enable others skilled in the art to best utilize the invention and various embodiments with various modifications as are suited to the particular use contemplated. It is intended that the scope of the invention be defined by the claims appended hereto and their equivalents.

What is claimed is:

1. A method of routing, comprising the steps of:
   a) assigning a first switching activity threshold value to a lower connectivity layer and a second switching activity threshold value to a higher connectivity layer, wherein said second threshold value is higher than said first threshold value;
   b) determining a switching activity for a signal path between a first circuit block and a second circuit block;
   c) selecting said higher connectivity layer instead of said lower connectivity layer if said switching activity for said signal path is above said first threshold value and below said second threshold value; and d) when said higher connectivity layer is selected, routing said signal path substantially in said higher connectivity layer.

2. The method of claim 1, wherein the step of determining said switching activity occurs prior to the step of routine said signal path.

3. The method of claim 1, further including the step of determining said signal path.

4. The method of claim 3, wherein the step of determining said signal path includes matching said signal path to a corresponding one of a plurality of nets in a netlist describing said first and second circuit blocks.

5. The method of claim 4, wherein the step of determining said switching activity includes simulating using said netlist.

6. The method of claim 5, wherein the step of determining said switching activity further includes converting an output file from said simulating to a switching activity file.

7. The method of claim 6, wherein said switching activity file includes a frequency of switching for said signal path over a predetermined time period.

8. The method of claim 7, wherein the step of selecting includes selecting said higher connectivity layer in response to a length of said signal path, a user-controlled factor, and said frequency of switching.

9. The method of claim 1, wherein each of said circuit blocks includes a standard cell configured to implement a logic or timing function.

10. The method of claim 5, wherein said simulating includes an event-based logic simulation.

11. The method of claim 10, wherein said event-based logic simulation includes a VERILOG simulation.

12. The method of claim 9, further including the step of accessing a technology library having a characterization of said standard cell.

13. The method of claim 1, wherein said higher connectivity layer is configured for lower capacitivity than said lower connectivity layer.

14. The method of claim 1, further including the step of synthesizing a circuit implementation in response to a hardware description.

15. The method of claim 1, wherein each of the circuit blocks includes an integrated circuit or component.

16. The method of claim 1, wherein said second circuit block includes a routing termination.

17. A computer-readable medium containing a set of instructions for execution on a computer, the instructions comprising the steps of:
   a) assigning a first weighting threshold value to a lower connectivity layer and a second weighting threshold value to a higher connectivity layer, wherein said second threshold value is higher than said first threshold value;
   b) determining a weighting of a signal path between first and second circuit blocks;
   c) selecting said higher connectivity layer instead of said lower connectivity layer if said weighting for said signal path is above said first threshold value and below said second threshold value; and
   d) when said higher connectivity layer is selected, routing said signal path substantially in said higher connectivity layer.

18. The medium of claim 17, further comprising at least one instruction for determining said signal path.

19. The medium of claim 18, wherein the step of determining said weighting further includes the step of determining a switching activity factor.

20. The medium of claim 19, wherein the step of determining said weighting further includes (i) multiplying said switching activity factor by a user-controlled factor to form a product and (ii) adding said product to a signal path length.

21. The medium of claim 20, wherein the step of determining said signal path occurs prior to the steps of selecting and routing.

22. The medium of claim 21, wherein the step of determining said signal path includes matching said signal path to a corresponding one of a plurality of nets in a netlist describing said first and second circuit blocks.

23. The medium of claim 22, wherein the step of determining said switching activity factor includes simulating using said netlist.

24. The medium of claim 17, wherein each of said circuit blocks includes a standard cell configured to implement a logic or timing function.

25. The medium of claim 17, further including at least one instruction for synthesizing a circuit implementation in response to a hardware description.

26. The medium of claim 17, wherein each of said circuit blocks includes an integrated circuit or component.

27. The medium of claim 17, wherein said second circuit block includes a routing termination.

28. A computer system comprising the medium of claim 17, configured to execute the set of instructions.

29. A method of connecting, comprising the steps of:
   a) assigning a first switching activity threshold value to a lower connectivity layer, and a second switching activity threshold value to a higher connectivity layer, wherein said second threshold value is higher than said first threshold value;
   b) placing first and second circuit blocks;
   c) determining a signal path between said first and second circuit blocks;
   d) determining a switching activity for said signal path; and
   e) selecting said higher connectivity layer instead of lower connectivity layer if said switching activity is above said first threshold value and below said second threshold value; and
   f) when said higher connectivity layer is selected, routing said signal path substantially in said higher connectivity layer.

30. The method of claim 29, wherein the step of determining said signal path includes accessing a netlist created by a synthesizer in response to a hardware description.

31. The method of claim 30, wherein the step of determining said switching activity includes simulating based on said netlist to determine a switching frequency.

32. The method of claim 31, wherein said simulating includes using an event-based logic state simulation.

33. The method of claim 31, wherein the step of determining said switching activity further includes forming a product of said switching frequency and a user-controlled factor.

34. The method of claim 33, wherein the step of selecting further includes comparing a weighting factor for said signal path and said predetermined value, said weighting factor including said product and a length of said signal path.

35. The method of claim 29, wherein said higher connectivity layer is a higher layer than said lower connectivity layer.

36. The method of claim 29, wherein said higher connectivity layer has a lower capacitance than said lower connectivity layer.

37. The method of claim 29, wherein said first and lower connectivity layers include metal layers.

38. The method of claim 29, wherein said second circuit block includes a routing termination.

39. A computer-readable medium containing a set of instructions for execution on a computer, said instructions adapted to perform the method of claim 29.

40. A computer system comprising the medium of claim 39, configured to execute the set of instructions.

41. A connection of circuit blocks, comprising:
 a) a first circuit block; and
 b) a second circuit block coupled to said first circuit block via a signal path, said signal path being substantially routed in a preferred connectivity layer, said preferred connectivity layer selected from a plurality of connectivity layers based at least in part on a switching activity of said signal path and on threshold switching activity values for each of said plurality of connectivity layers.

42. The connection of claim 41, wherein said preferred connectivity layer is selected to reduce a capacitivity as said switching activity increases.

43. The connection of claim 41, wherein each of said circuit blocks includes a standard cell configured to implement a logic or timing function.

44. The connection of claim 41, wherein each of said circuit blocks includes an integrated circuit or component.

* * * * *

UNITED STATES PATENT AND TRADEMARK OFFICE
CERTIFICATE OF CORRECTION

PATENT NO. : 7,260,804 B1
APPLICATION NO. : 10/946688
DATED : August 21, 2007
INVENTOR(S) : Michael Burstein et al.

It is certified that error appears in the above-identified patent and that said Letters Patent is hereby corrected as shown below:

IN THE CLAIMS

Claim 2, col. 11, line 5: change "step of routine said signal path" to --step of routing said signal path--.

Claim 34, col. 12, line 60: change "said predetermined value" to --a predetermined value--.

Signed and Sealed this
Ninth Day of August, 2011

David J. Kappos
*Director of the United States Patent and Trademark Office*